United States Patent
Shin et al.

(10) Patent No.: US 8,107,248 B2
(45) Date of Patent: Jan. 31, 2012

(54) FLEXIBLE DEVICE, FLEXIBLE PRESSURE SENSOR

(75) Inventors: Kyu-ho Shin, Seoul (KR); Chang-youl Moon, Suwon-si (KR); Yong-jun Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 372 days.

(21) Appl. No.: 12/435,783

(22) Filed: May 5, 2009

(65) Prior Publication Data

US 2009/0273909 A1  Nov. 5, 2009

Related U.S. Application Data

(62) Division of application No. 11/221,935, filed on Sep. 9, 2005, now abandoned.

(30) Foreign Application Priority Data

Sep. 10, 2004  (KR) .................................. 2004-72630

(51) Int. Cl.
*H05K 1/00* (2006.01)

(52) U.S. Cl. ......... 361/749; 361/763; 361/782; 174/254

(58) Field of Classification Search .......... 361/749–750; 606/33–47; 174/254–258
See application file for complete search history.

(56) References Cited

U.S. PATENT DOCUMENTS

| 4,603,249 | A | | 7/1986 | Hoppe et al. |
| 5,644,230 | A | | 7/1997 | Pant et al. |
| 5,689,139 | A | | 11/1997 | Bui et al. |
| 5,788,692 | A | * | 8/1998 | Campbell et al. ............... 606/33 |
| 5,851,854 | A | | 12/1998 | Haghiri-Tehrani et al. |
| 5,852,289 | A | | 12/1998 | Masahiko |
| 6,263,229 | B1 | * | 7/2001 | Atalar et al. .................. 600/423 |
| 6,673,068 | B1 | * | 1/2004 | Berube .......................... 606/33 |

FOREIGN PATENT DOCUMENTS

| JP | 5211275 A | 8/1993 |
| JP | 8-008575 A | 1/1996 |
| JP | 11354712 A | 12/1999 |
| JP | 200369034 A | 3/2003 |

* cited by examiner

*Primary Examiner* — Tuan T Dinh
(74) *Attorney, Agent, or Firm* — Sughrue Mion, PLLC

(57) ABSTRACT

A flexible device and a flexible pressure sensor. The present flexible device includes: a first flexible substrate formed of a flexible material to have a flexibility; an active element formed to have a predetermined thickness and a flexibility, and being attached on the first flexible substrate; and a second flexible substrate formed of a flexible material to have a flexibility, and being deposited on the active element. The flexible device and the flexible pressure sensor have a high flexibility, so that they may be applied for a medical treatment such as implantation to a living body, a human body and so forth. In addition, the flexible device has a high flexibility, so that it may be inserted to a curved surface, which contributes to remove the limit of space where the semiconductor package device may be inserted.

8 Claims, 11 Drawing Sheets

FLEXIBLE DEVICE, FLEXIBLE PRESSURE SENSOR

CROSS-REFERENCE TO RELATED APPLICATIONS

This is a Divisional Application of U.S. application Ser. No. 11/221,935 filed Sep. 9, 2005, which claims priority under 35 U.S.C. §119 from Korean Patent Application No. 2004-72630, filed on Sep. 10, 2004. The entire disclosure of the prior applications are incorporated herein by reference in their entirety.

BACKGROUND OF THE INVENTION

1. Field of the Invention

The present invention relates to a semiconductor package device and a method of fabricating the same and, in particular, to a semiconductor package device in which a semiconductor device fabricated on a wafer is embedded and a method of fabricating the same.

2. Description of the Related Art

Semiconductor devices (e.g. chips) fabricated on a wafer are electrical devices, however, they may be not directly used by users and are apt to be broken. Accordingly, in order to use the semiconductor devices, they must be subjected to a packaging process for protection. The semiconductor devices fabricated on the wafer are subjected to the packaging process to be complete semiconductor package devices.

The packaging process means a process of forming electrical interconnections in the semiconductor device and then molding it for preventing the semiconductor device from being damaged due to an external environment. The molding has a tendency to increase a thickness so as to prevent the semiconductor device from external impacts (e.g. thermal impact, mechanical impact), which acts as a cause of allowing a thickness of the semiconductor package device to be increased. In order to implement a small-sized semiconductor package device, it may be fabricated to be small and thin, however, which causes it to be readily broken, so that there exists a limit in making it small and thin.

In recent years, attention has been paid to a medical technique of implanting the semiconductor package device to the human body to be used for medical treatment. To this end, the semiconductor package device must be supported by not only a small-sized feature but also a flexible feature.

Accordingly, there exists a need for implementing a 'flexible semiconductor package device' (hereinafter, it will be referred to as a 'flexible device' for simplicity) which implants the flexible device to the human body or attaching it on any curved surface.

SUMMARY OF THE INVENTION

It is therefore one object of the present invention to provide a flexible device having a high flexibility, a flexible pressure sensor, and a fabrication method thereof.

According to one aspect of the present invention, there is provided a flexible device, which includes a first flexible substrate formed of a flexible material to have a flexibility; an active element formed to have a predetermined thickness and a flexibility, and being attached on the first flexible substrate; and a second flexible substrate formed of a flexible material to have a flexibility, and being deposited on the active element.

The active element may be any one of a logic integrated circuit (IC), a central processing unit (CPU), a memory, a digital signal processor (DSP), a sensor, an actuator, and a communication device.

In addition, a thickness of the active element may be 50 μm or less.

And the flexible device may further include another active element which is formed to have a predetermined thickness and a flexibility and is attached below the first flexible substrate.

In addition, the flexible device may further include a passive element formed in the first flexible substrate. The passive element may be any one of a resistor, an inductor, and a capacitor.

The first and second flexible substrates may be formed of a flexible high molecular material. And the high molecular material may be polyimide.

According to other aspect of the present invention, there is provided a method of fabricating a flexible device, which includes: a) preparing an active element formed to have a predetermined thickness and a flexibility; b) attaching the active element on a first flexible substrate formed of a flexible material to have a flexibility; and c) depositing, on the active element, a second flexible substrate formed of a flexible material to have a flexibility.

The a) step may include a1) forming a plurality of the active elements with a predetermined thickness on one region of a wafer; a2) etching regions between the active elements by the predetermined thickness; a3) attaching a tape to the active elements; a4) attaching a substrate to the tape; a5) polishing a region other than the one region of the wafer; and a6) preparing the active element by removing any one of the active elements attached to the tape from the tape.

The a2) step may include performing wet etching on the regions between the active elements.

The a5) step may include performing chemical polishing on the region other than the one region.

In addition, the active element may have a thickness in a range of 50 μm or less.

The b) step may include performing attaching the active element on the first flexible substrate using one method between thermo-compression bonding and adhesive bonding methods.

The method may further include attaching another active element formed with a predetermined thickness to have a flexibility, below the first flexible substrate.

And the method may further include forming a passive element in the first flexible substrate.

According to another aspect of the present invention, there is provided a flexible pressure sensor, which includes a flexible substrate formed of a flexible material to have a flexibility, and allowing a circular shape to be formed when it is bent; a first electrode formed in one surface of the flexible substrate; a second electrode formed in the one surface of the flexible substrate, and facing the first electrode to form a capacitor when the flexible substrate is formed to have the circular shape; and a coil formed in the other surface of the flexible substrate, and forming a resonance circuit electrically connected to a capacitor formed by the first and second electrodes, and outputting a signal corresponding to a resonance frequency which changes in response to a change of a capacitance between the first electrode and the second electrode.

The capacitance between the first electrode and the second electrode may change in response to a change of a diameter of a material interposed between the first electrode and the second electrode. In addition, the interposed material may be a blood vessel.

The flexible pressure sensor may further include another flexible substrate formed of a flexible material to have a flexibility, allowing a circular shape to be formed when it is bent, and being deposited on the coil.

The flexible substrate may be formed of a flexible high molecular material. And the high molecular material may be polyimide.

The first and second electrodes may be formed of gold (Au) and the coil may be formed of copper (Cu).

According to still another aspect of the present invention, there is provided a method of fabricating a flexible pressure sensor, which includes forming a first electrode in one surface of a flexible substrate, the flexible substrate being formed of a flexible material to have a flexibility and allowing a circular shape to be formed when it is bent; forming a second electrode formed in the one surface of the flexible substrate, and facing the first electrode to form a capacitor when the flexible substrate is formed to have the circular shape; and forming a coil in the other surface of the flexible substrate, the coil forming a resonance circuit electrically connected to a capacitor formed by the first and second electrodes and outputting a signal corresponding to a resonance frequency which changes in response to a change of a capacitance between the first electrode and the second electrode.

The method may further include depositing another flexible substrate on the coil, the another flexible substrate being formed of a flexible material to have a flexibility and allowing a circular shape to be formed when it is bent.

BRIEF DESCRIPTION OF THE DRAWINGS

The above aspects and features of the present invention will be more apparent by describing exemplary embodiments of the present invention with reference to the accompanying drawings, in which.

DETAILED DESCRIPTION OF ILLUSTRATIVE, NON-LIMITING, EMBODIMENTS OF THE INVENTION

Hereinafter, exemplary embodiments of the present invention will be described in detail with reference to accompanying drawings. The described exemplary embodiments are intended to assist in the understanding of the invention, and are not intended to limit the scope of the invention in any way.

Figure 1A:
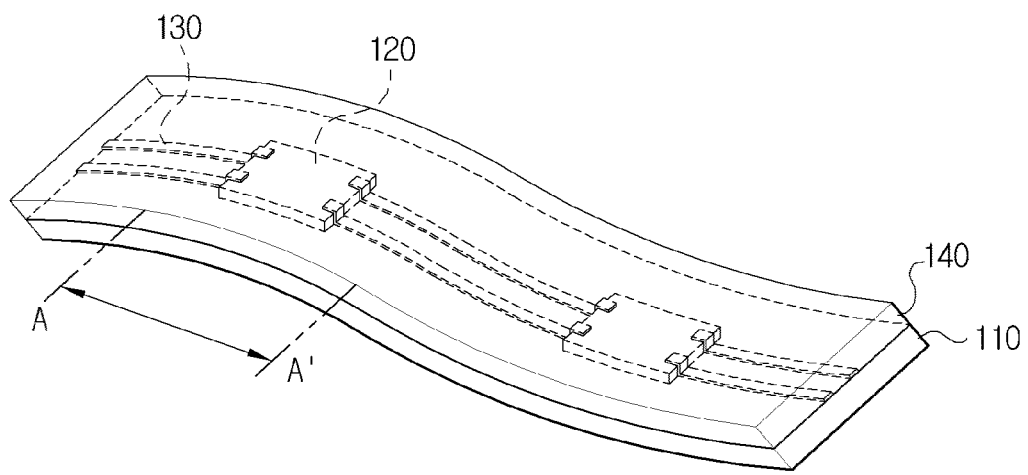
FIG. 1A is a perspective view of a flexible device in accordance with one exemplary embodiment of the present invention.
Figure 1B:
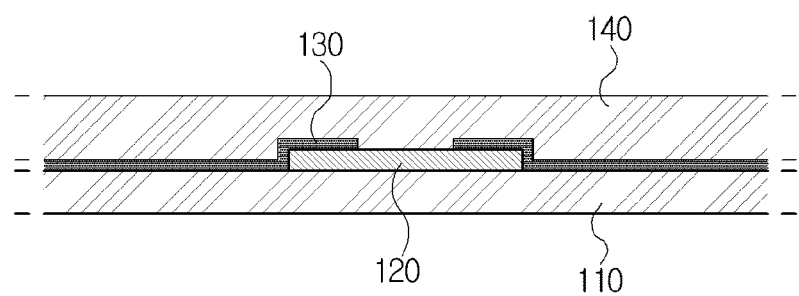
FIG. 1B is a cross-sectional view of a flexible device shown in FIG. 1A.

FIG. 1A is a perspective view is a flexible device in accordance with one exemplary embodiment of the present invention, and FIG. 1B is a cross-sectional view taken along an electrical interconnection 130 within an A-A' range of the flexible device shown in FIG. 1A. Referring to FIGS. 1A and 1B, the present flexible device has a first flexible substrate 110, a second flexible substrate 140, an active element 120, and an electrical interconnection 130. The active element 120 is attached on the first flexible substrate 110 and the electrical interconnection 130 is formed thereon, and the second flexible substrate 140 is deposited on the active element 120 and the electrical interconnection 130.

The first flexible substrate 110 is one which has a flexibility, and is formed of a flexible material. In particular, the first flexible substrate 110 may be a substrate fabricated with a flexible high molecular material. In this case, polyimide may be applied as the high molecular material.

The active element 120 is attached on the first flexible substrate 110. In this case, thermo-compression bonding, adhesive bonding, and so forth may be applied for a method of attaching the active element 120 on the substrate.

A logic integrated circuit (IC), a central processing unit (CPU), a memory, a digital signal processor (DSP), a sensor, an actuator, a communication device and so forth may be applied for the active element 120. However, the kind of the active element 120 is not limited, so that other kinds besides the above-described examples may be applied for the active element 120.

In the meantime, the active element 120 has a flexibility. The flexibility of the active element 120 aids in implementing the present flexible device. The active element 120 having the flexibility may be implemented by making its thickness thin.

Figure 2:
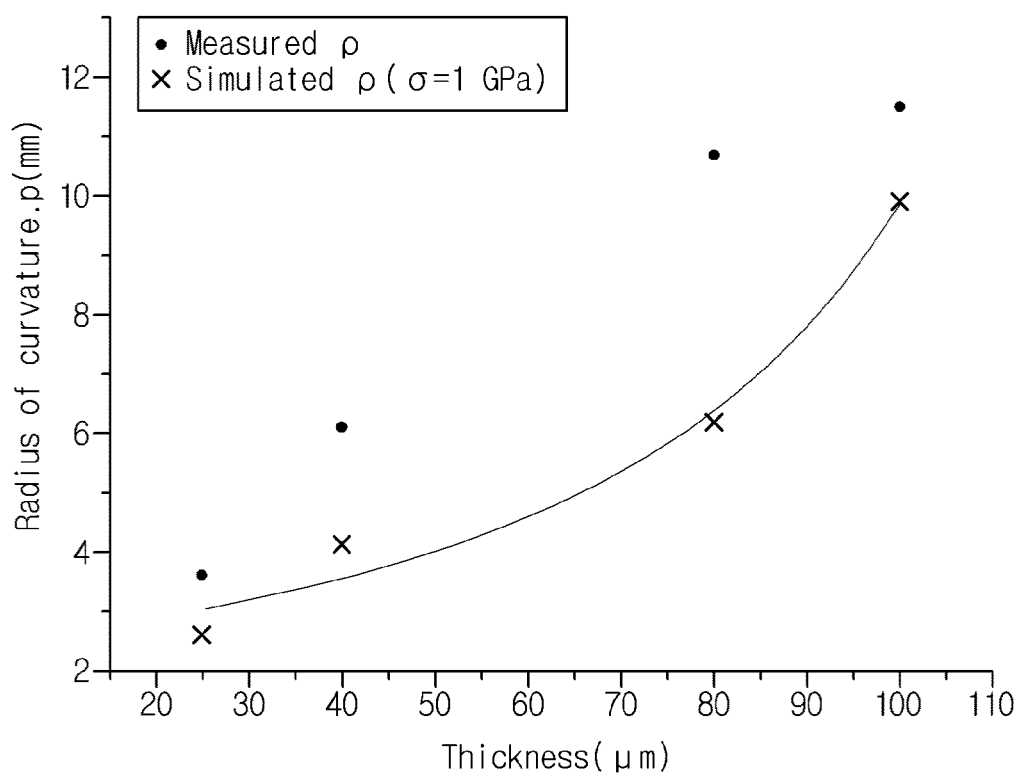
FIG. 2 is a graph illustrating a radius of curvature of a silicon chip in response to a thickness change of the silicon chip.

The active element 120 is generally implemented as a silicon chip. A thick silicon chip has hardly any flexibility (that is, it has a 'rigid' or 'brittle' property), however, it has a flexibility when a thickness of the silicon chip becomes thin (i.e. when it is decreased to a value of tens of μm or less). FIG. 2 is a graph illustrating a radius of curvature of the silicon chip in response to the thickness change, an "idealistic radius of curvature" (straight line) of the silicon chip, a "radius of curvature measured by computer simulation" (X mark), and an "actually measured radius of curvature" (· mark) are shown in response to the thickness change in FIG. 2. Referring to FIG. 2, it can be seen that the radius of curvature is decreased when the thickness of the silicon chip becomes thinner. That is, it can be seen that the flexibility of the silicon chip is increased when the thickness becomes thinner.

The property that the flexibility is increased when the thickness of the material used to form the silicon chip is thinner as described above, may be equally applied to implementation of the present active element 120. Accordingly, the thickness of the active element 120 may be made as thin as possible in order to allow the active element 120 have a flexibility. 50 μm is suitable for a thickness of the active element 120 in consideration of the current technique level. However, in consideration of a tendency that the thickness of the active elements becomes thinner, it will also be possible to implement the active element which has a far thinner thickness in the future.

A description will be given with referring back to FIGS. 1A and 1B.

An electrical interconnection 130 is formed on the first flexible substrate 110 for electrically interconnecting the active element 120. Although not shown, passive elements such as a resistor, an inductor, and a capacitor may be formed in the first flexible substrate 110. An insulator, which is not shown, either, may also be formed in the first flexible substrate 110. In this case, the electrical interconnection, 130, the passive element, and the insulator may be formed such that they are thin and have flexibility.

The second flexible substrate 140 is formed to be deposited on the active element 120 and the electrical interconnection 130. The second flexible substrate 140 is one which has a flexibility and is formed of a flexible material. The second flexible substrate 140 may be formed of the same material as the first flexible substrate 110. Accordingly, the second flexible substrate 140 may be implemented as a substrate formed of a flexible high molecular material, wherein polyimide may be applied for the high molecular material.

As mentioned above, all of the first flexible substrate 110, the active element 120, the electrical interconnection 130, and the second flexible substrate 140 which constitute the present flexible device, have flexibility. As a result, the present flexible device also has flexibility.

Hereinafter, a description of process of fabricating an active element 120 having a flexibility and a process of fabricating a flexible device will be given in detail. A process of fabricating the active element 120 having a flexibility is first described. FIGS. 3A to 3D are cross-sectional views per process step for explaining a process of fabricating the active element 120.

Figure 3A:
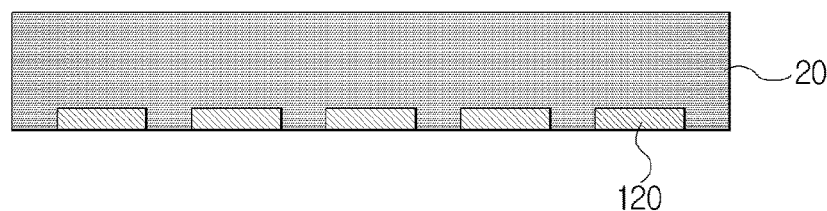
FIGS. 3A to 3D are cross-sectional views for explaining a process of fabricating an active element.

As shown in FIG. 3A, a plurality of active elements 120 are serially formed in a region (i.e. a bottom region of FIG. 3A) of a silicon wafer 20. In this case, the active element 120 is formed to have its thickness as thin as possible in order to allow the active element 120 to have the flexibility. In particular, it is preferable for the active element 120 to have a thickness of 50 µm or less.

Figure 3B:
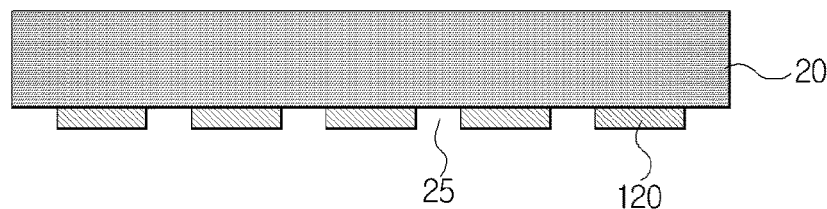

Regions between the plurality of active elements 120 are then etched to form a plurality of grooves 25 as shown in FIG. 3B. A depth of the groove 25 is equal to a thickness of the active element 120. Any one between dry etching and wet etching may be employed for the etching method. Using wet etching helps to protect physical structures of the active elements 120.

Figure 3C:
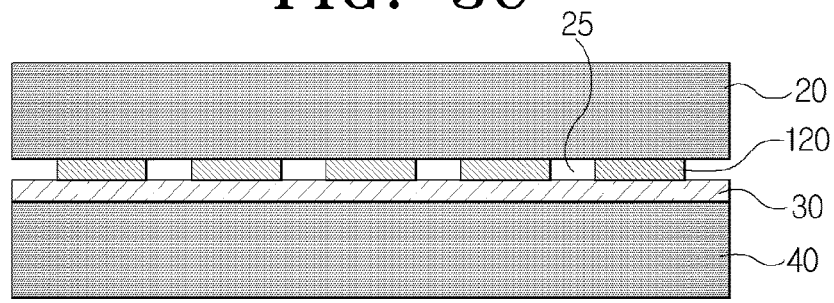

A tape 30 is then attached to the plurality of active elements 120 as shown in FIG. 3C, and a substrate 40 is attached to the tape 30. In this case, a thermal release tape may be employed for the tape 30.

Figure 3D:
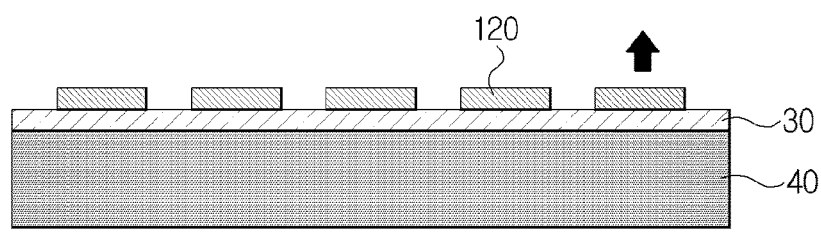

The silicon wafer 20 is then polished and removed as shown in FIG. 3D. Any one between physical polishing and chemical polishing may be employed for the polishing method. Using chemical polishing which uses a chemical material helps protect physical structures of the active elements 120.

The plurality of active elements 120 is then removed from the tape 30 (in the direction of the arrow shown in FIG. 3D).

Sawing using a diamond wheel is not employed in a process of fabricating the present active element 120. A technique employing the process as shown in FIGS. 3A to 3D is instead introduced such that regions between the plurality of active elements 120 are wet etched to form a plurality of grooves 25 and the silicon wafer 20 is chemically polished to dice the plurality of active elements 120, because the active element 120 has a thin thickness (e.g. 50 µm or less) so that it is apt to be brittle or broken due to a vibration of the diamond wheel when sawing using the diamond wheel is carried out.

Figure 4A:
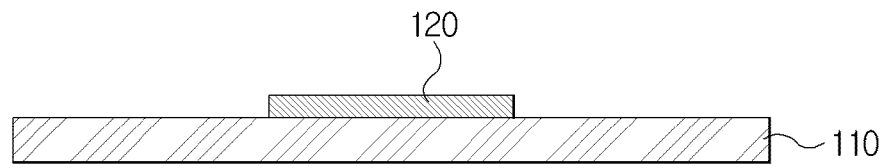
FIGS. 4A to 4C are cross-sectional views for explaining a process of fabricating a flexible device.
Figure 4B:
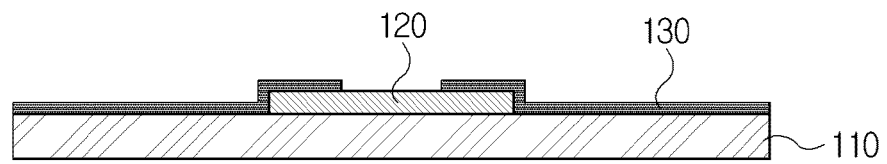
Figure 4C:
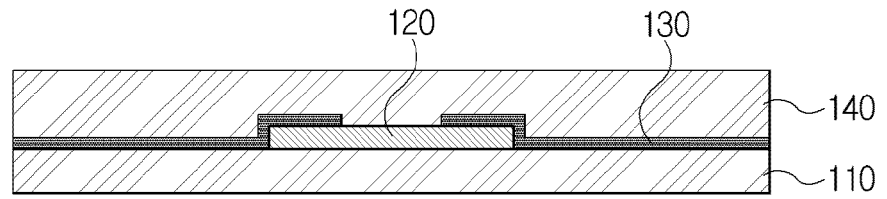

Hereinafter, a process of fabricating a flexible device will be described in detail. FIGS. 4A to 4C are cross-sectional views of steps for explaining a process of fabricating the flexible device An active element 120 having a flexibility is first attached on the first flexible substrate 110 having a flexibility as shown in FIG. 4A. In this case, thermo-compression bonding, adhesive bonding and so forth may be applied for a method of attaching the active element 120.

An electrical interconnection 130 for electrically interconnecting the active element 120 is then formed on the first flexible substrate 110 as shown in FIG. 4B. Passive elements such as a resistor, an inductor and a capacitor, and an insulator may also be formed on the first flexible substrate 110 if necessary. The electrical interconnection 130, the passive element, and the insulator may be formed to have a thin thickness so that they have a flexibility.

A second flexible substrate 140 having a flexibility is then deposited on the active element 120 and the electrical interconnection 130 as shown in FIG. 4C.

The active element 120 having a flexibility, the flexible device having a flexibility, and a fabrication process thereof have been described up to now.

Figure 5A:
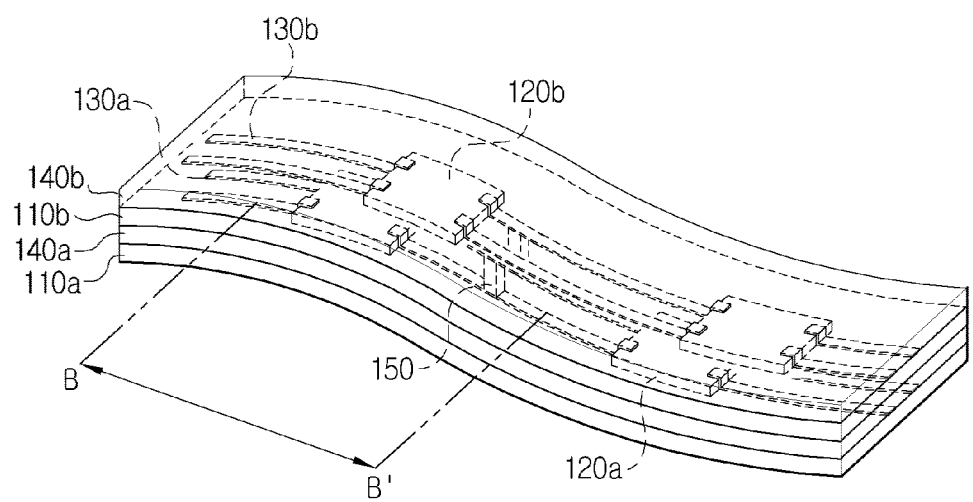
FIG. 5A is a perspective view of a flexible device in accordance with another exemplary embodiment of the present invention.

The present flexible devices may be stacked to each other so that a resultant flexible device having a different structure may be implemented. Referring to FIG. 5A, a perspective view of a flexible device having a different structure is shown such that the two flexible devices shown in FIG. 1A are stacked. And FIG. 5B is a cross-sectional view of a flexible device shown in FIG. 5A which is taken along electrical interconnections 130a and 130b within a B-B' range.

Figure 5B:
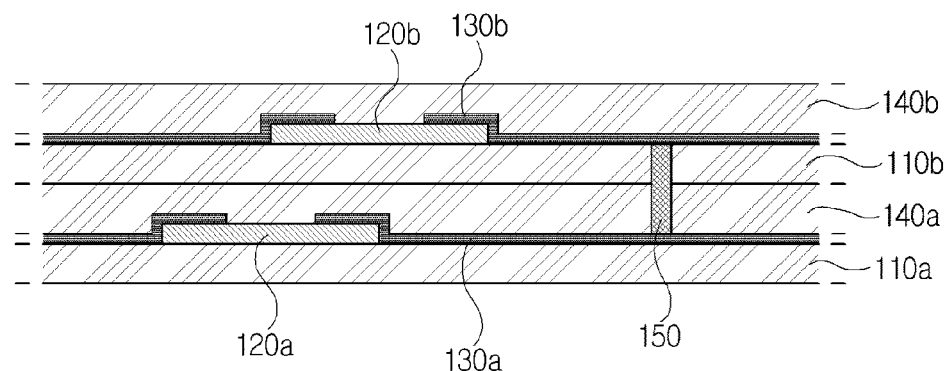
FIG. 5B is a cross-sectional view of a flexible device shown in FIG. 5A.

It can be seen that the flexible device shown in FIGS. 5A and 5B has a structure in which a flexible device having the first flexible substrate 110b, the active element 120b, the electrical interconnection 130b, and the second flexible substrate 140b are stacked on a flexible device having the first flexible substrate 110a, the active element 120a, the electrical interconnection 130a, and the second flexible substrate 140a. In addition, it can be seen that a passive element 150 is formed in the flexible substrates 110b and 140a.

Figure 6:
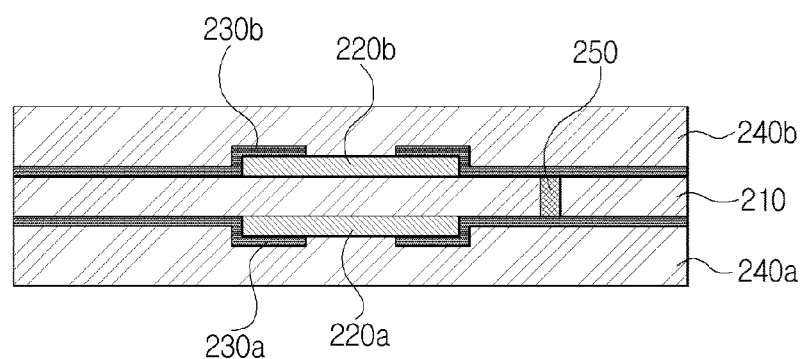
FIG. 6 is a perspective view of a flexible device in accordance with another exemplary embodiment of the present invention.

Alternatively, a flexible device having a structure different from that of FIG. 5B is shown in FIG. 6. It can be seen from the flexible device shown in FIG. 6 that a passive element 250 is formed in the first flexible substrate 210, and active elements 220b and 220a are attached above and below the first flexible substrate 210, respectively and electrical interconnections 230b and 230a are respectively formed thereon, and the second flexible substrates 240a and 240b are deposited on the active elements 220a and 220b and the electrical interconnection 230a and 230b.

Hereinafter, a flexible pressure sensor as one kind of the flexible device will be described. The flexible pressure sensor has a flexibility, and may be fabricated to a have a fine-sized structure. In this case, the flexible pressure sensor may be implanted into the human body so that it may be used as a device for measuring a blood pressure. Hereinafter, the present flexible pressure sensor will be described in detail assuming that the flexible pressure sensor is implanted into the human body to be used as a device for measuring a blood pressure.

Figure 7A:
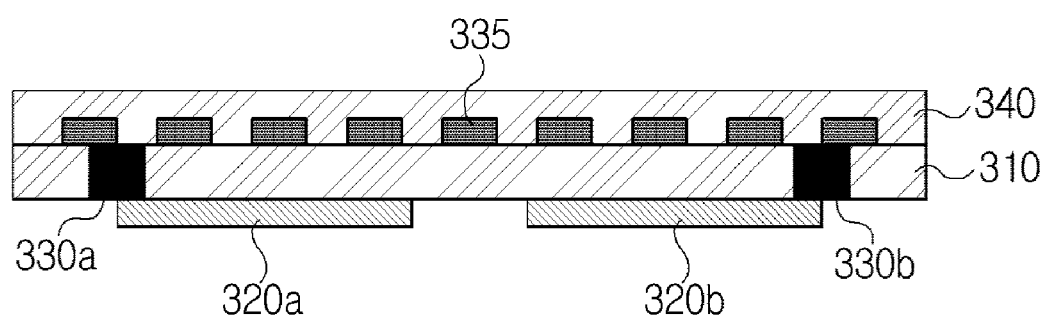
FIG. 7A is a cross-sectional view of a flexible pressure sensor in accordance with one exemplary embodiment of the present invention.
Figure 7B:
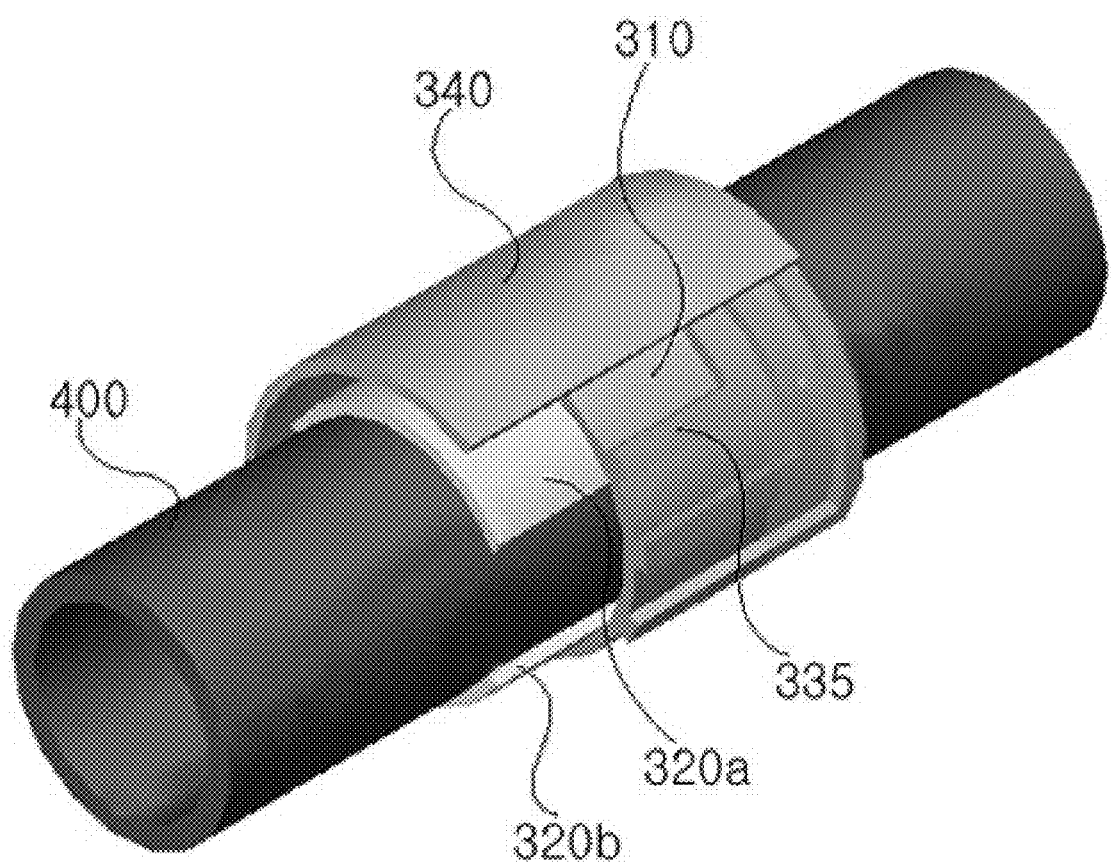
FIG. 7B is a view illustrating a state that a blood vessel is surrounded by a flexible pressure sensor shown in FIG. 7A.

FIG. 7A is a cross-sectional view of the flexible pressure sensor in accordance with one exemplary embodiment of the present invention, and FIG. 7B is a view illustrating a state that a blood vessel is surrounded by the flexible pressure sensor shown in FIG. 7A.

Referring to FIGS. 7A and 7B, the present exemplary embodiment of the flexible pressure sensor has a first flexible substrate 310, first and second electrodes 320a and 320b, first and second wires 330a and 330b, a coil 335, and a second flexible substrate 340. Since the present flexible pressure sensor has a flexibility, it may have a circular shape when it is bent. Accordingly, the present flexible pressure sensor may surround the blood vessel 400.

The first and second wires 330a and 330b are formed in the first flexible substrate 310, and the first and second electrodes 320a and 320b are formed below the wires, and the coil 335 is formed thereon, and the second flexible substrate 340 is deposited on the coil 335.

The first flexible substrate 310 is one having a flexibility, and is preferably formed of a flexible high molecular material such as polyimide. Since the first flexible substrate 310 has flexibility, it may have a circular shape when it is bent.

The first electrode 320a and the second electrode 320b are formed below the first flexible substrate 310 by a predetermined interval. In this case, the thickness of the first and second electrodes 320a and 320b may be made thin so that they have a flexibility. And in consideration of the flexible pressure sensor which is implanted into the human body, the first and second electrodes 320a and 320b may be formed of Gold (Au), which is harmless to the human body.

When the first flexible substrate 310 is bent to have a circular shape, the first electrode 320a and the second electrode 320b face each other. As a result, the first and second electrodes 320a and 320b constitute a capacitor. In this case, the blood vessel 400 and bloods flowing through the blood vessel 400 serve as a dielectric material.

The coil 335 is formed on the first flexible substrate 310. In this case, the thickness of the coil 335 may be made thin so that it has a flexibility. The coil 335 may be formed of copper (Cu).

The coil 335 is electrically connected to the first and second electrodes 320a and 320b through the first and second wires 330a and 330b. As such, when the 'capacitor formed by the first and second electrodes 320a and 320b' and the 'coil 335' are electrically connected to each other, an LC resonance circuit is formed. In the meantime, the coil 335 externally outputs a radio frequency (RF) signal corresponding to a resonance frequency of the LC resonance circuit.

The second flexible substrate 340 is deposited on the coil 335. The second flexible substrate 340 is one having a flexibility and may be formed of a flexible high molecular material such as polyimide. Since the second flexible substrate 320 has the flexibility, it may have a circular shape when it is bent.

Hereinafter, a principle of measuring the blood pressure of the present flexible pressure sensor will be described in detail with reference to FIGS. 8A and 8B.

Figure 8A:
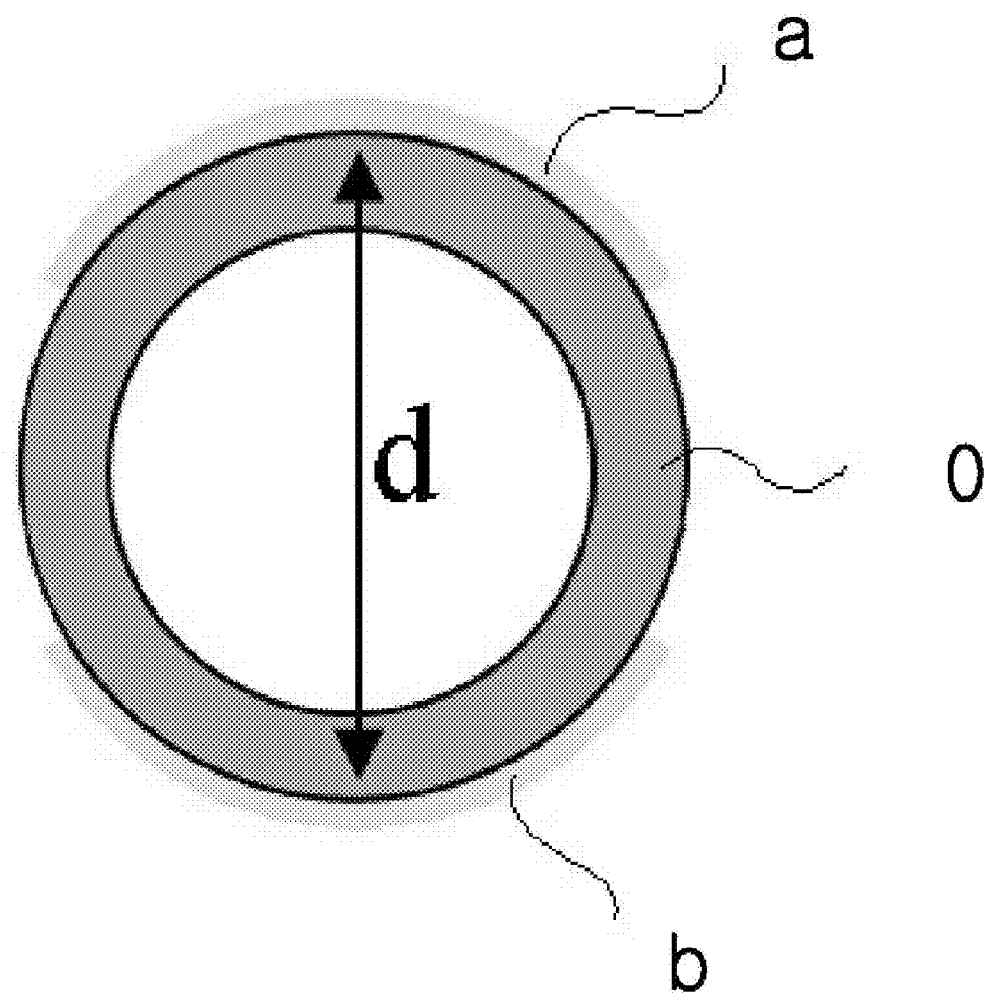
FIG. 8A is a view for explaining a principle of measuring a blood pressure of a flexible pressure sensor.

FIG. 8A is a view for explaining a principle of measuring a blood pressure of the present flexible pressure sensor. A capacitance (C) of the 'capacitor formed by the first electrode 320a and the second electrode 320b' (hereinafter, it will be referred to as a capacitor for simplicity) is inverse proportion to the 'interval between the first electrode 320a and the second electrode 320b' (d) (hereinafter, it will be referred to an 'inter-electrode interval' for simplicity). This may be expressed as the equation 1 below:

$$C = \varepsilon \frac{s}{d}$$ Equation 1

Wherein '$\varepsilon$' indicates a dielectric rate of a dielectric material (i.e. the blood vessel 400 and the blood flowing through the blood vessel 400), and 's' indicates a cross-sectional area of the first electrode 320a or the second electrode 320b.

The 'inter-electrode interval (d)' is equal to a 'diameter of the blood vessel 400'. The 'diameter of the blood vessel 400' changes in response to the 'blood pressure'. That is, the 'blood pressure' change causes the 'diameter of the blood vessel 400' to be changed, and the change of the 'diameter of the blood vessel 400' causes the 'inter-electrode interval (d)' to be changed, which causes the 'capacitance of the capacitor (C)' to be changed. Consequently, it can be understood that the change of the 'blood pressure' causes the 'capacitance of the capacitor (C)' to be changed.

In the meantime, a resonance frequency (F) of the 'LC resonance circuit formed by the coil 335 and the capacitor' (hereinafter, it will be referred to as an 'LC resonance circuit' for simplicity) may be expressed as the equation 2 below:

$$F = \frac{1}{2\pi} \frac{1}{\sqrt{LC}}$$ Equation 2

Wherein, the 'L' indicates an inductance of the coil 335. According to the equation 2, it may be understood that the change of the 'capacitance (C) of the capacitor' causes the 'resonance frequency (F) of the LC resonance circuit' to be changed.

The above-described description may be summarized as follows. The change of the 'blood pressure'→change of the 'diameter of the blood vessel 400'→change of the 'inter-electrode interval (d)'→change of the 'capacitance (C) of the capacitor'→change of the 'resonance frequency (F) of the LC resonance circuit' are sequentially progressed. Accordingly, it can be understood that the change of 'blood pressure' causes the 'resonance frequency (F) of the LC resonance circuit' to be changed.

Figure 8B:
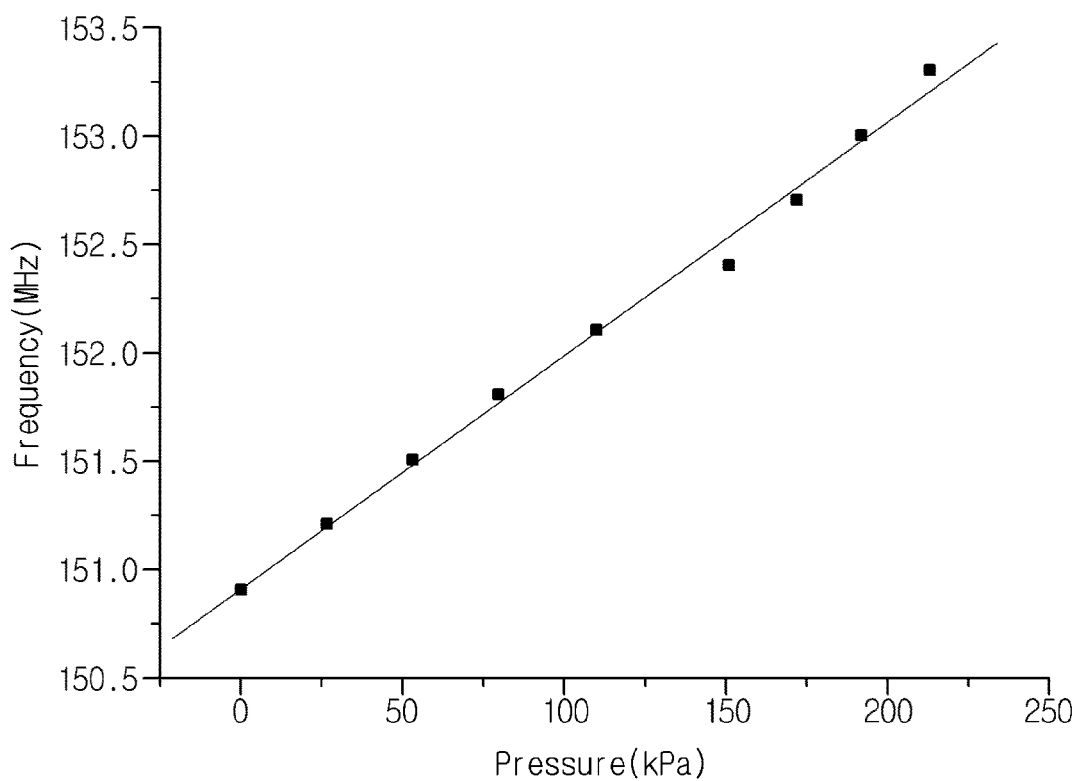
FIG. 8B is a graph illustrating a resonance frequency change in response to a blood pressure change.

FIG. 8B is a graph illustrating the change of the resonance frequency change in response to the change of the blood pressure. Referring to FIG. 8B, it can be seen that the resonance frequency (F) is increased when the blood pressure is increased, and is decreased when the blood pressure is decreased.

As mentioned above, the coil externally outputs an RF signal corresponding to the resonance frequency (F) of the LC resonance circuit. Accordingly, information about the blood pressure is contained in the RF signal output from the coil 335.

Figure 9:
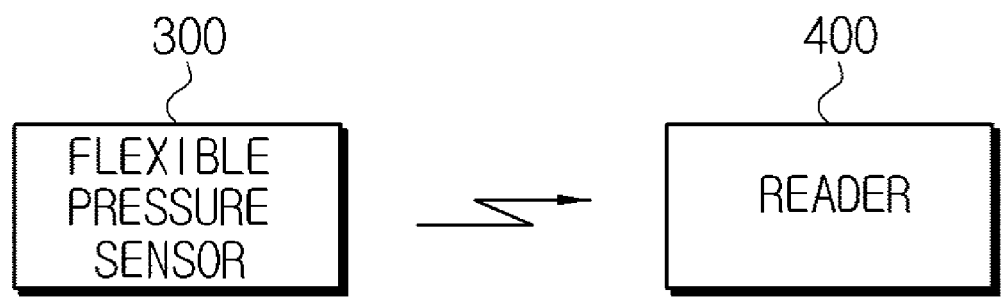
FIG. 9 is a concept view of a real time system of measuring a blood pressure.

When the RF signal output from the coil 335 is received and the frequency of the signal is analyzed, the information about the blood pressure may be obtained. And the blood pressure may be measured in real time when the RF signal is output and analyzed in real time. FIG. 9 shows a concept view of a real time system of measuring the blood pressure.

The real time system of measuring the blood pressure may be implemented to have the above-described flexible pressure sensor 300 and a reader 400 which receives the RF signal output from the flexible pressure sensor 300 and analyzes the frequency of the signal. The reader 400 may be implemented so as to check the blood pressure by analyzing the frequency of the RF signal output from the flexible pressure sensor 300 and provide a warning sound when the blood pressure is not in a normal state.

Regarding cases having cardio and/or vascular problems, an emergency state of a patient may be immediately noticed when the flexible pressure sensor 300 is implanted into a body of the patient and the patient himself has the portable reader 400 or the reader is attached to a mobile phone.

Hereinafter, a process of fabricating the flexible pressure sensor shown in FIG. 7A will be described in detail. FIGS. 10A to 10E are cross-sectional views of several steps, for explaining a process of fabricating the flexible pressure sensor.

Figure 10A:
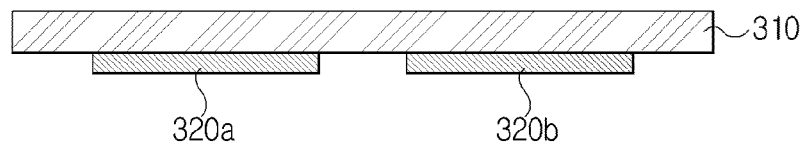
FIGS. 10A to 10E are cross-sectional views of process steps for explaining a process of fabricating a flexible pressure sensor.

A first electrode 320a is first formed below the first flexible substrate 310 having a flexibility as shown in FIG. 10A, and a second electrode 320b is formed to be spaced from the first electrode 320a by a predetermined interval. In this case, when the first flexible substrate 310 is bent to have a circular shape, the second electrode 320b faces the first electrode 320a to be formed at position where a capacitor may be formed.

In this case, the thickness of the first and second electrodes 320a and 320b may be made thin so that they have a flexibility, and the first and second electrodes 320a and 320b may be formed of Gold (Au), which is harmless to the human body.

Figure 10B:
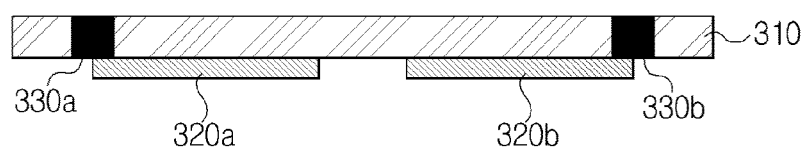

First and second wires 330a and 330b are formed in the first flexible substrate 310 as shown in FIG. 10B. In this case, the first and second wires 330a and 330b are formed to be electrically connected to the first and second electrodes 320a and 320b, respectively.

Figure 10C:
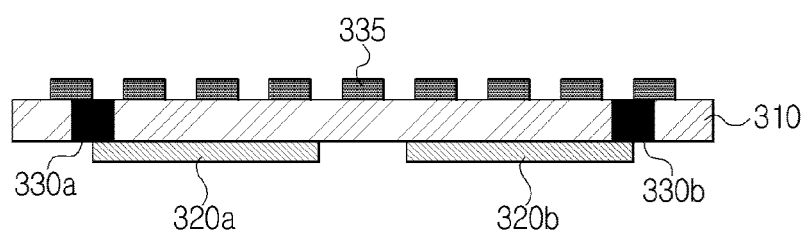

A coil 335 is then formed on the first flexible substrate 310 as shown in FIG. 10C. In this case, the coil 335 is formed to be electrically connected to the first and second wires 330a and 330b. And the thickness of the coil 335 may be made thin so that it may have a flexibility. The coil 335 may be formed of copper (Cu).

Figure 10D:
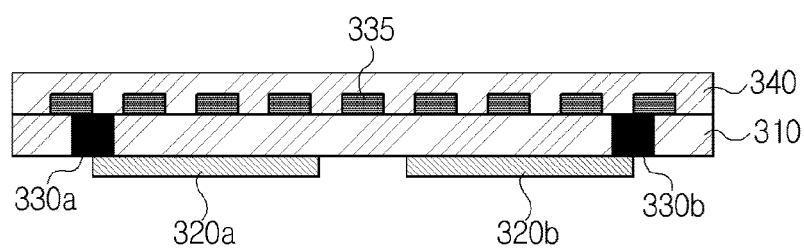

A second flexible substrate 340 having a flexibility is then deposited on the coil 335 as shown in FIG. 10D. Accordingly, the flexible pressure sensor shown in FIG. 7A is completed.

Figure 10E:
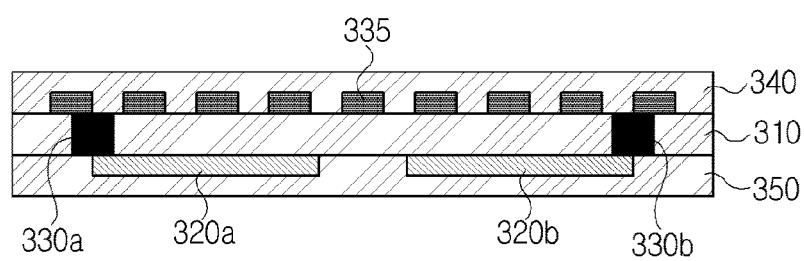

In the meantime, as shown in FIG. 10E, a third flexible substrate 350 having a flexibility may be further deposited below the flexible pressure sensor (i.e. below the first and second electrodes 320a and 320b) shown in FIG. 10D.

As mentioned above, according to an exemplary embodiment of the present invention, the flexible device having a high flexibility and the flexible pressure sensor as one kind of the flexible device may be implemented. They all have a high flexibility and may be fabricated to have a fine-sized structure, so that they may be applied for a medical treatment such as implantation to a living body, a human body and so forth. In addition, the flexible device has a high flexibility, so that it may be implanted to a curved surface, which contributes to removal of the limit of space where the semiconductor package device may be inserted.

The present exemplary embodiments of the invention enables a user to select a print density level, to thereby properly change a print density based on an amount of a developing agent loaded in the developer so that images of good quality can be obtained all the time.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A flexible pressure sensor, comprising:
   a flexible substrate formed of a flexible material to have a flexibility, and allowing a circular shape to be formed when the flexible substrate is bent;
   a first electrode formed in one surface of the flexible substrate;
   a second electrode formed in the one surface of the flexible substrate, and facing the first electrode to form a capacitor when the flexible substrate is formed to have the circular shape; and
   a coil formed in the other surface of the flexible substrate, and forming a resonance circuit electrically connected to the capacitor formed by the first and second electrodes, and outputting a signal corresponding to a resonance frequency which changes in response to a change of a capacitance between the first electrode and the second electrode.

2. The flexible pressure sensor as claimed in claim 1, wherein the capacitance between the first electrode and the second electrode changes in response to a change of a diameter of a material interposed between the first electrode and the second electrode.

3. The flexible pressure sensor as claimed in claim 2, wherein the interposed material is a blood vessel.

4. The flexible pressure sensor as claimed in claim 1, further comprising: another flexible substrate formed of a flexible material to have a flexibility, allowing a circular shape to be formed when the another flexible substrate is bent, and being deposited on the coil.

5. The flexible pressure sensor as claimed in claim 1, wherein the flexible substrate is formed of a flexible high molecular material.

6. The flexible pressure sensor as claimed in claim 5, wherein the high molecular material is polyimide.

7. The flexible pressure sensor as claimed in claim 1, wherein the first and second electrodes are formed of gold (Au).

8. The flexible pressure sensor as claimed in claim 1, wherein the coil is formed of copper (Cu).

* * * * *